United States Patent
Zhang et al.

(10) Patent No.: US 9,478,482 B2
(45) Date of Patent: Oct. 25, 2016

(54) OFFSET INTEGRATED CIRCUIT PACKAGING INTERCONNECTS

(71) Applicant: NVIDIA CORPORATION, Santa Clara, CA (US)

(72) Inventors: Leilei Zhang, Sunnyvale, CA (US); Zuhair Bokharey, Fremont, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 256 days.

(21) Appl. No.: 13/683,385

(22) Filed: Nov. 21, 2012

(65) Prior Publication Data

US 2014/0138824 A1    May 22, 2014

(51) Int. Cl.
| | |
|---|---|
| H01L 23/48 | (2006.01) |
| H01L 23/52 | (2006.01) |
| H01L 29/40 | (2006.01) |
| H01L 23/488 | (2006.01) |
| H01L 21/48 | (2006.01) |
| H01L 23/00 | (2006.01) |
| H01L 23/498 | (2006.01) |

(52) U.S. Cl.
CPC ......... *H01L 23/488* (2013.01); *H01L 21/4853* (2013.01); *H01L 23/49838* (2013.01); *H01L 24/16* (2013.01); *H01L 2924/07802* (2013.01)

(58) Field of Classification Search
None
See application file for complete search history.

(56) References Cited

U.S. PATENT DOCUMENTS

| | | | | |
|---|---|---|---|---|
| 4,581,680 | A * | 4/1986 | Garner | 361/768 |
| 6,170,155 | B1 * | 1/2001 | Marion et al. | 29/840 |
| 6,310,403 | B1 * | 10/2001 | Zhang et al. | 257/786 |
| 7,109,061 | B2 | 9/2006 | Crane et al. | |
| 8,080,884 | B2 * | 12/2011 | Nakamura et al. | 257/780 |
| 8,508,054 | B2 * | 8/2013 | Pang et al. | 257/778 |
| 2002/0089067 | A1 * | 7/2002 | Crane et al. | 257/778 |
| 2002/0109238 | A1 * | 8/2002 | Hilton | 257/778 |
| 2004/0026107 | A1 * | 2/2004 | Caldwell et al. | 174/52.4 |
| 2005/0011660 | A1 * | 1/2005 | Caldwell et al. | 174/52.1 |

FOREIGN PATENT DOCUMENTS

| | | |
|---|---|---|
| TW | 445597 B | 7/2001 |
| TW | 200828464 A | 7/2008 |

* cited by examiner

*Primary Examiner* — Hoang-Quan Ho
(74) *Attorney, Agent, or Firm* — Artegis Law Group, LLP

(57) ABSTRACT

One embodiment of the present invention sets forth an integrated circuit package including a substrate, an integrated circuit die, and a plurality of solder bump structures. The substrate includes a first plurality of interconnects disposed on a first surface of the substrate. The integrated circuit die includes a second plurality of interconnects disposed on a first surface of the integrated circuit die. The plurality of solder bump structures couple the first plurality of interconnects to the second plurality of interconnects. The first plurality of interconnects are configured to be substantially aligned with the second plurality of interconnects when the integrated circuit package is at a first temperature within a range of about 0° C. to about −100° C. The first plurality of interconnects are configured to be offset from the second plurality of interconnects when the integrated circuit package is at a temperature above the first temperature.

11 Claims, 5 Drawing Sheets

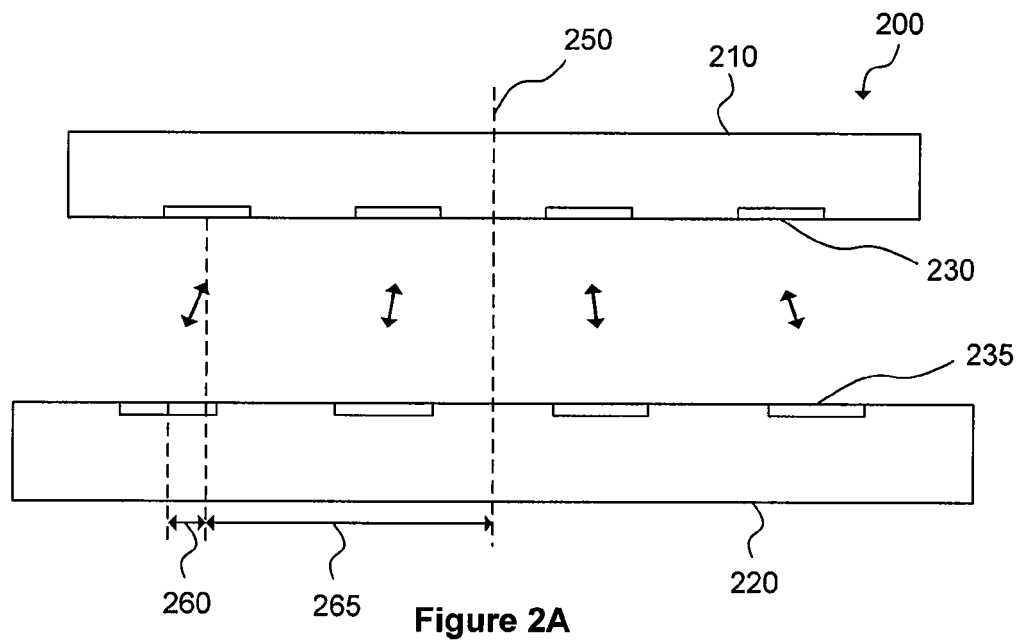
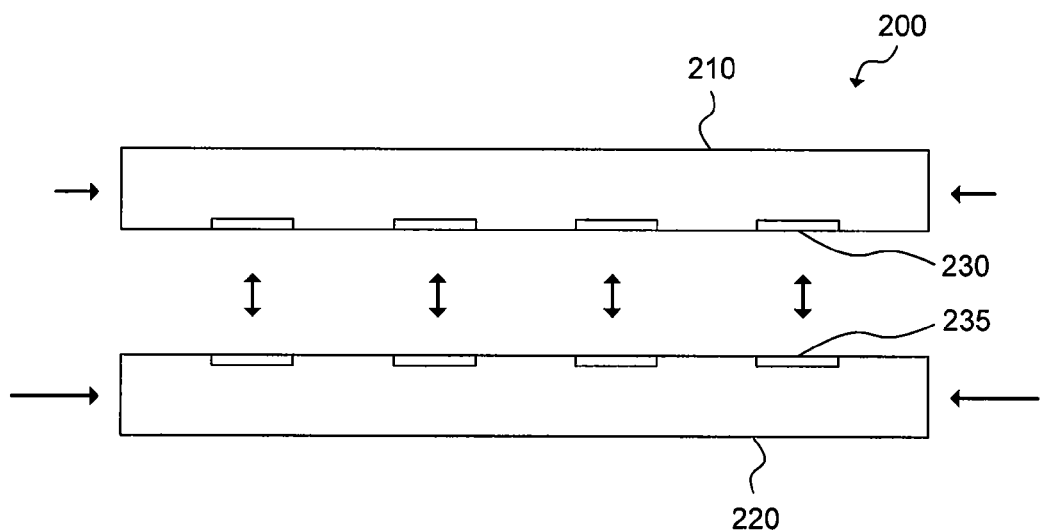

US 9,478,482 B2

OFFSET INTEGRATED CIRCUIT PACKAGING INTERCONNECTS

BACKGROUND OF THE INVENTION

1. Field of the Invention

Embodiments of the present invention generally relates to integrated circuit packaging interconnects.

2. Description of the Related Art

Integrated circuit (IC) fabrication is a multi-step sequence which includes processes such as patterning, deposition, etching, and metallization. Typically, in the final processing steps, the resulting IC die are separated and packaged. IC packaging serves several purposes, including providing an electrical interface with the die, providing a thermal medium through which heat may be removed from the die, and/or providing mechanical protection for the die during subsequent usage and handling.

One type of IC packaging technique is referred to as "flip chip" packaging. In flip chip packaging, after the metallization process is complete, solder bump structures (e.g., solder balls, pads, etc.) are deposited on the die, and the die is separated from the wafer (e.g., via dicing, cutting, etc.). The die is then inverted and positioned on a substrate so that the solder bumps align with electrical connections formed on the substrate. Heat is applied via a solder reflow process to re-melt the solder bumps and attach the die to the substrate. The die/substrate assembly may further be underfilled with a non-conductive adhesive to strengthen the mechanical connection between the die and the substrate.

IC fabrication techniques have enabled the production of larger-sized die having higher and higher transistor densities. Consequently, IC packaging techniques have encountered challenges for providing packaging which supports the requisite number of electrical connections. In general, as the size of the die and number of electrical connections to the die is increased, the size of the package is increased. Further, as package size is increased, the thermal properties of the die and packaging materials become a more important factor.

One relevant thermal property of the die and packaging materials is the coefficient of thermal expansion (CTE). In flip chip packaging, for example, during the solder reflow process, the die is attached to the substrate at an elevated temperature. Upon cooling, a CTE mismatch between the die and the substrate may cause shear and/or tensile stresses on the solder bump structures which attach the die to the substrate. Consequently, repeatedly cycling the IC package from an operating temperature to a non-operating temperature may result in failure of the solder bump structures.

Accordingly, there is a need in the art for a more effective way of reducing the incidence of solder bump structure failure caused by thermal cycling of an IC package.

SUMMARY OF THE INVENTION

One embodiment of the present invention sets forth an integrated circuit package including a substrate, an integrated circuit die, and a plurality of solder bump structures. The substrate has a first coefficient of thermal expansion and includes a first plurality of interconnects disposed on a first surface of the substrate. The integrated circuit die has a second coefficient of thermal expansion and includes a second plurality of interconnects disposed on a first surface of the integrated circuit die. The plurality of solder bump structures couple the first plurality of interconnects to the second plurality of interconnects. The first plurality of interconnects are configured to be substantially aligned with the second plurality of interconnects when the integrated circuit package is at a first temperature within a range of about 0° C. to about −100° C. The first plurality of interconnects are configured to be offset from the second plurality of interconnects when the integrated circuit package is at a temperature above the first temperature.

Further embodiments provide a method for fabricating an integrated circuit package.

One advantage of the disclosed technique is that, by shifting the incidence of tensile and shear stresses from low temperatures, when the solder bump structures are cold and brittle, to high temperatures, when the solder bump structures are warm and ductile, the likelihood of failure of the solder bump structures is reduced.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2C illustrate an offset integrated circuit package having aspects of an embodiment of the present invention;

DETAILED DESCRIPTION

In the following description, numerous specific details are set forth to provide a more thorough understanding of embodiments of the present invention. However, it will be apparent to one of skill in the art that embodiments of the present invention may be practiced without one or more of these specific details.

Figure 1A:
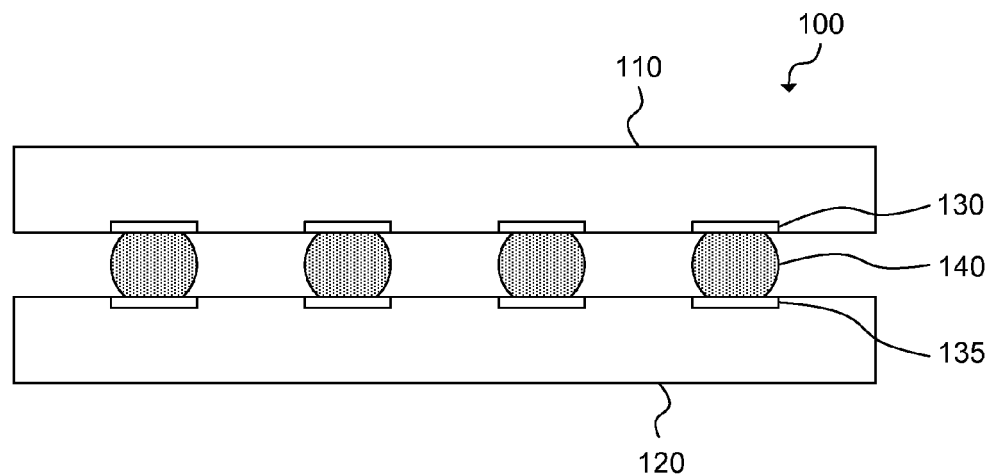
FIGS. 1A and 1B illustrate schematic views of an integrated circuit package having a conventional configuration.
Figure 1B:
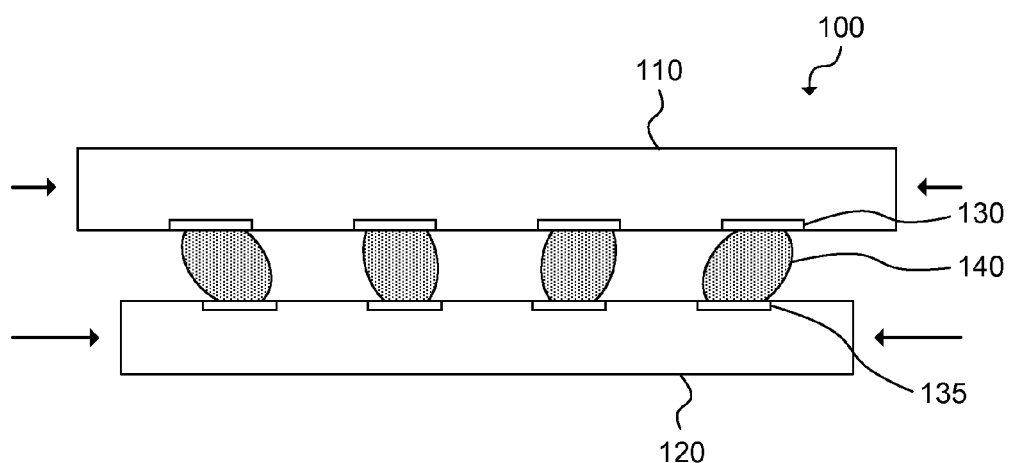

FIGS. 1A and 1B illustrate schematic views of an integrated circuit (IC) package 100 having a conventional configuration. The conventional IC package 100 includes a die 110, a conventional substrate 120, a plurality of die interconnects 130, a plurality of substrate interconnects 135, and a plurality of solder balls 140. The plurality of solder balls 140 mechanically and electrically couple the die 110 to the conventional substrate 120 and provide electrical connections between the die interconnects 130 and the substrate interconnects 135.

FIG. 1A illustrates the conventional IC package 100 when heated to an operating temperature. In conventional "flip chip" configurations, the conventional IC package 100 is configured such that the die interconnects 130 align with the substrate interconnects 135 when the conventional IC package 100 is heated to an operating temperature.

FIG. 1B illustrates the conventional IC package 100 when cooled to a temperature below about 0° C. Due to a mismatch between the coefficient of thermal expansion (CTE) of the die 110 and the coefficient of thermal expansion of the conventional substrate 120, the die interconnects 130 and the substrate interconnects 135 become misaligned when the conventional IC package 100 is cooled. As a result, the solder balls 140 experience shear and tensile stresses, as illustrated in FIG. 1B. Moreover, in the conventional configuration, these stresses are experienced by the solder balls 140 when the solder balls 140 are cold and brittle, increasing the likelihood of failure of the solder balls 140 (e.g., due to cracking or delamination).

Figure 2C:
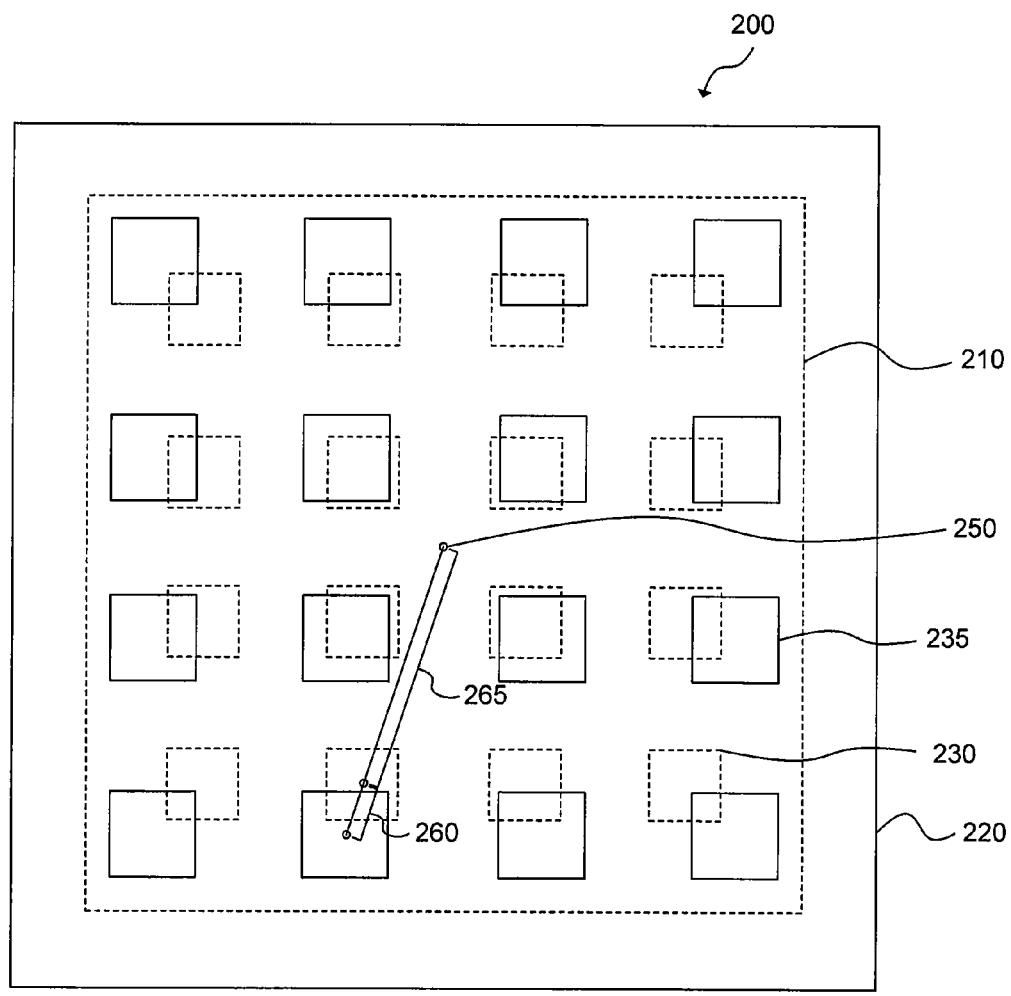

FIGS. 2A-2C illustrate an offset integrated circuit (IC) package 200 having aspects of the present invention. The offset IC package 200 includes an IC die 210, a substrate 220, a plurality of IC die interconnects 230, and a plurality of substrate interconnects 235.

FIGS. 2A and 2C illustrate the offset IC package 200 when heated to an operating temperature of about 50° C. to about 150° C. The offset IC package 200 is configured such that the plurality of substrate interconnects 235 are offset from the plurality of IC die interconnects 230 by an offset distance (A) 260 when the IC package 200 is heated to an operating temperature. More specifically, each substrate interconnect 235 is offset from a corresponding IC die interconnect 230 as a function of a distance (D) 265 of the substrate interconnect 235 from a center point 250 of the substrate 220. Additionally, the offset distance 260 may be a function of the coefficients of thermal expansion of the IC die 210 and substrate 220, and the difference between the operating temperature of the offset IC package 200 ($T_2$) and the temperature to which the offset IC package 200 is cooled ($T_1$). An exemplary formula for calculating the offset distance 260 is shown below in Equation 1.

$$A = (CTE_{substrate} - CTE_{die}) * D * (T_2 - T_1) \quad \text{(Eq. 1)}$$

FIG. 2B illustrates the offset IC package 200 when cooled to a temperature of about 0° C. to about −100° C. Upon cooling, due to the mismatch in the coefficients of thermal expansion of the IC die 210 and substrate 220, the substrate 220 shrinks at a different rate than the IC die 210. In the exemplary embodiment provided herein, $CTE_{substrate}$ is higher than $CTE_{die}$, and, consequently, the substrate 220 shrinks at a higher rate than the IC die 210. When the offset IC package 200 reaches a cooled temperature, each substrate interconnect 235 is substantially aligned with an IC die interconnect 230.

Figure 3A:
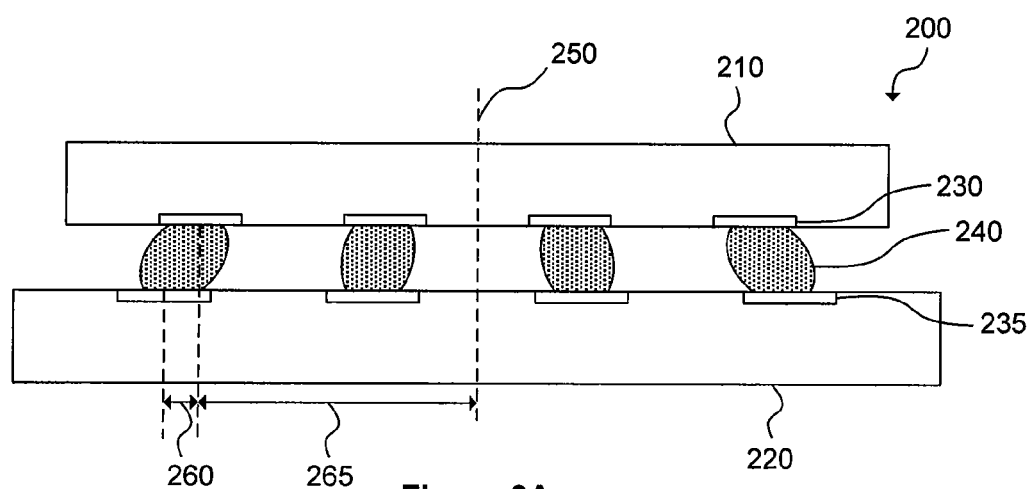
FIGS. 3A and 3B illustrate the offset integrated circuit package of FIGS. 2A and 2B after solder reflow processing.
Figure 3B:
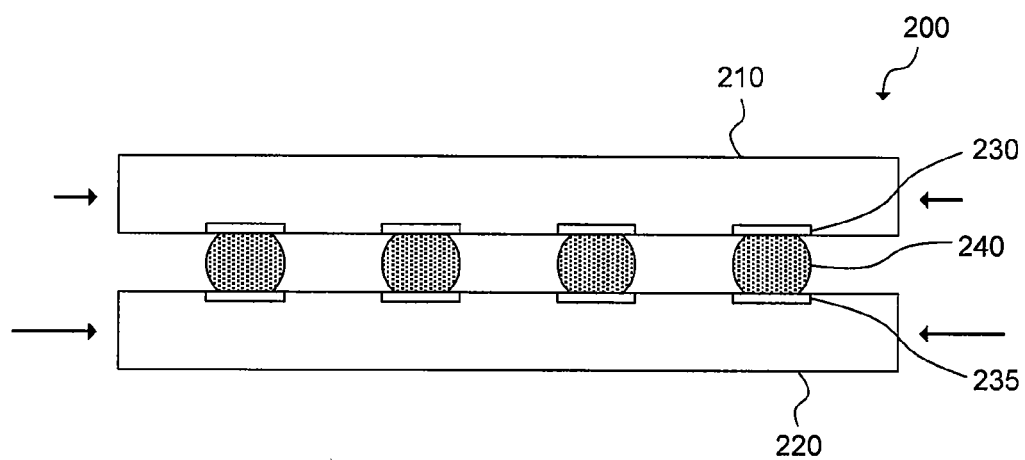

FIGS. 3A and 3B illustrate the offset integrated circuit (IC) package 200 of FIGS. 2A and 2B after solder reflow processing. The offset IC package 200 includes an integrated circuit (IC) die 210, a substrate 220, a plurality of IC die interconnects 230, a plurality of substrate interconnects 235, and a plurality of solder bump structures 240. The plurality of IC die interconnects 230 are mechanically and electrically coupled to the plurality of substrate interconnects 235 with the plurality of solder bump structures 240.

FIG. 3A illustrates the offset IC package 200 when heated to an operating temperature of about 50° C. to about 150° C. FIG. 3B illustrates the offset IC package 200 when cooled to a temperature of about 0° C. to about −100° C. As described above with respect to FIGS. 2A and 2B, when the offset IC package 200 is heated to an operating temperature, the substrate interconnects 235 are offset from the IC die interconnects 230, and when the offset IC package 200 is cooled, the substrate interconnects 235 are substantially aligned with the IC die interconnects 230. Advantageously, this configuration improves the reliability of the solder bump structures 240 during repeated thermal cycling of the offset IC package 200. For example, whereas conventional IC package configurations subject solder bump structures to shear and tensile stresses when the solder bump structures are cold and brittle, the offset IC package 200 is configured so that the solder bump structures 240 are subjected to such stresses at elevated temperatures. As a result, the solder bump structures 240 are subjected to shear and tensile stresses when the solder bump structures 240 are ductile, significantly decreasing the likelihood of failure. Further, when the offset IC package 200 is cooled, the substrate interconnects 235 and the IC die interconnects 230 are substantially aligned. Consequently, the solder bump structures 240 are subjected to lower shear and tensile stresses when the solder bump structures 240 are cold and brittle, decreasing the likelihood of failure of the solder bump structures 240 at low temperatures.

The offset IC package configurations illustrated in FIGS. 2A, 2B, 3A and 3B are particularly useful in large die applications, where a CTE mismatch between a substrate and a die can result in large displacements near the edges of the IC package. As a result, in large die applications, solder bump structures near the edges of the IC package may experience shear and tensile forces which are orders of magnitude higher than the shear and tensile forces experienced by solder bump structures near the center of the IC package. Other thermal effects, such as warping of the substrate, can further increase these stresses and, thus, increase the likelihood of failure. Consequently, by configuring the offset IC package 200 such that interconnects 230, 235 are offset at high temperatures, when the solder bump structures 240 are ductile, and aligned at low temperatures, when the solder bump structures 240 are brittle, the likelihood of cold temperature failure is significantly reduced.

The IC die 210 may be any type of electronic circuit capable of being packaged. Examples of IC die include, without limitation, central processing unit (CPU) die, system-on-chip (SoC) die, microcontroller die, volatile memory die (e.g., dynamic random-access memory (DRAM) die, DRAM cubes), non-volatile memory die (e.g., flash memory, magnetoresistive RAM), and the like. The substrate 220 may be any type of substrate capable of being used for packaging integrated circuit. Examples of substrates include, without limitation, interposers, dielectric carriers (e.g., ceramics, glass), printed circuit boards, semiconductor wafers, and the like. The solder bump structures 240 may be any type of material or structure capable of forming a mechanical and/or electrical connection between a die and an IC package substrate. Examples of solder bump structures include, without limitation, solder balls, solder pads, and copper pillar bumps.

Figure 4:
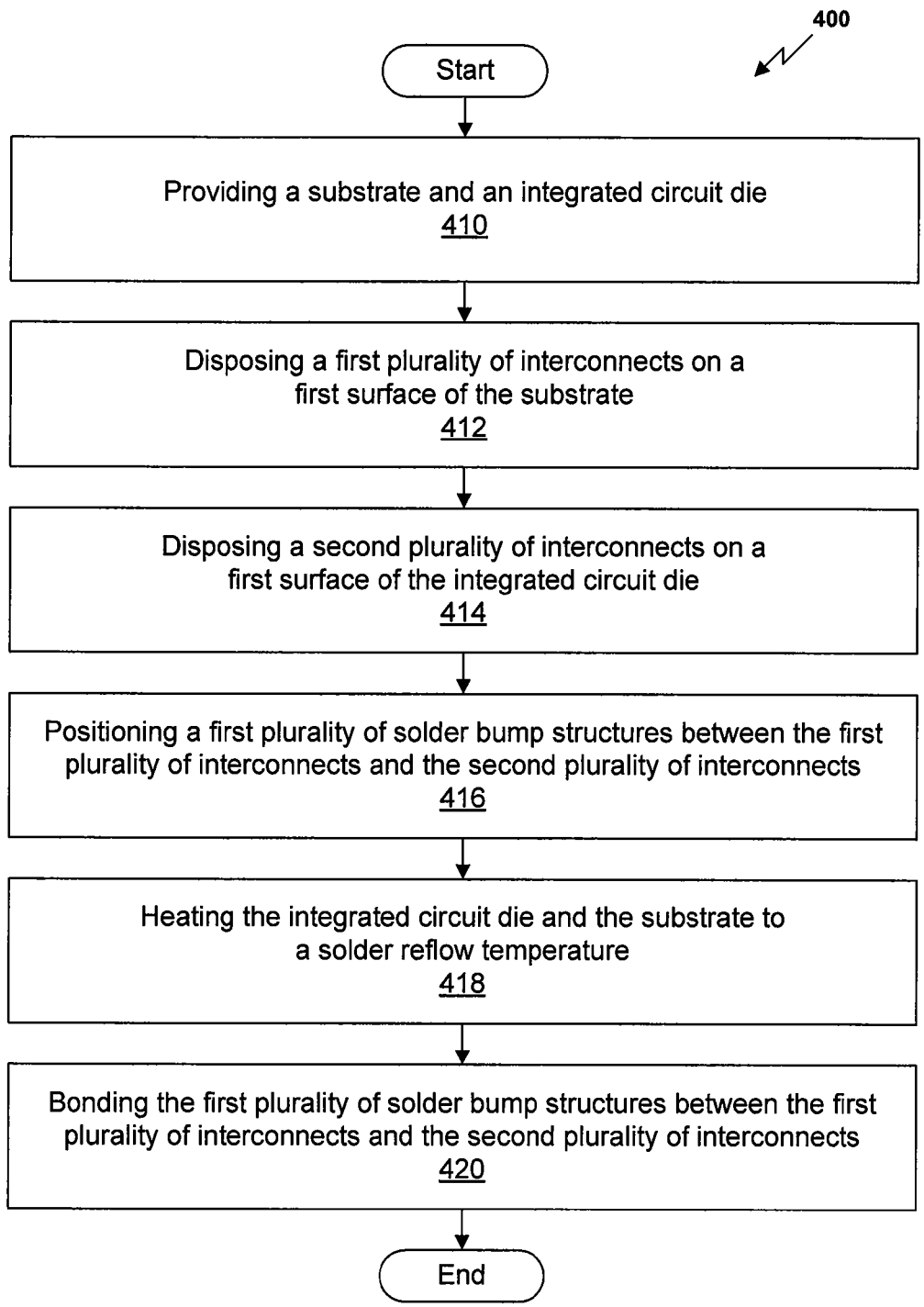
FIG. 4 is a flow diagram illustrating a method for fabricating an integrated circuit package according to an embodiment of the present invention.

FIG. 4 is a flow diagram illustrating a method for fabricating an integrated circuit package according to an embodiment of the present invention. Although the method steps are described in conjunction with the exemplary embodiments illustrated in FIGS. 2A, 2B, 3A and 3B, other variations will be apparent to persons of ordinary skill in the art.

At step 410, a substrate 220 and an IC die 210 are provided. At step 412, a first plurality of interconnects 235 are disposed on a first surface of the substrate 220. At step 414, a second plurality of interconnects 230 are disposed on a first surface of the IC die 210. The first and second plurality of interconnects 230, 235 may include electrical connections, such as under bump metallurgy (UBM) structures. The first plurality of interconnects 235 may be configured to be substantially aligned with the second plurality of interconnects 230 when the IC package 200 is at a first temperature within a range of about 0° C. to about −100° C., such as about −25° C. to about −100° C. or about −50° C. to about −100° C. Additionally, the first plurality of interconnects 235 may be configured to be offset from the second plurality of interconnects 230 when the IC package 200 is at a temperature above the first temperature.

Disposing the first plurality of interconnects 235 on the first surface of the substrate 220 at step 412 may include determining an offset 260 of each of the first plurality of interconnects 235 with respect to the second plurality of interconnects 230 disposed on the IC die 210. The offset 260 may be calculated such that, when the IC package 200 is cooled to the first temperature, the first plurality of interconnects 235 align with the second plurality of interconnects 230. Consequently, when the first plurality of interconnects 235 are disposed (e.g., fabricated) on the substrate 220 at a temperature which is above the first temperature, several factors may be taken into consideration to calculate an appropriate offset 260. For instance, above the first temperature, the substrate 220 may expand about a reference point, such as a center point 250 of the substrate 220. Consequently, each offset 260 may be calculated based on factors including: (1) the difference between the CTE of the substrate 220 and the CTE of the IC die 210; (2) the difference between the temperature at which the first plurality of interconnects 235 are disposed on the substrate 220 and the first temperature at which the first plurality of interconnects 235 are configured to be substantially aligned with the second plurality of interconnects 230; and (3) the distance 265 to the reference point of the substrate. The distance 265 to the reference point may be calculated from a location on the substrate 220 over which an interconnect of the second plurality of interconnects 230 aligns at the temperature at which the first plurality of interconnects 235 are disposed on the substrate 220.

Next, at step 416, a plurality of solder bump structures 240 are positioned between the first plurality of interconnects 235 and the second plurality of interconnects 230. At step 418, the substrate 220 and IC die 210 are heated to a solder reflow temperature. In the exemplary embodiment provided herein, the solder reflow temperature may be from about 150° C. to about 300° C., such as about 200° C. to about 250° C. Finally, at step 420, the plurality of solder bump structures 240 are bonded between the first plurality of interconnects 235 and the second plurality of interconnects 230.

In sum, configuring an IC package such that the solder bump (or UBM) structures on the die are offset from the solder bump (or UBM) structures on the substrate when the IC package is heated to an operating temperature (e.g., 50 to 125° C.), and aligned when the IC package is cooled to a non-operating temperature (e.g., 20° C. or below), may reduce the likelihood of failure of these structures caused by thermal cycling. Specifically, when the IC package is heated to an operating temperature, the ductility of the solder bumps is increased, decreasing the likelihood of failure due to sheer and tensile stresses caused by a mismatch in the coefficients of thermal expansion (CTE) of the die and substrate. In addition, when the IC package is cooled to a non-operating temperature and the ductility of the solder bumps is decreased, the solder bump and/or UBM structures on the die and substrate are aligned.

One advantage of the disclosed technique is that, by shifting the incidence of tensile and shear stresses from low temperatures, when the solder bump structures are cold and brittle, to high temperatures, when the solder bump structures are warm and ductile, the likelihood of failure of the solder bump structures is reduced.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

What is claimed:

1. An integrated circuit package comprising:
   a substrate having a first coefficient of thermal expansion and comprising a first plurality of interconnects disposed on a first surface of the substrate;
   an integrated circuit die having a second coefficient of thermal expansion and comprising a second plurality of interconnects disposed on a first surface of the integrated circuit die; and
   a plurality of solder bump structures coupling the first plurality of interconnects to the second plurality of interconnects,
   wherein, for each interconnect in the first plurality of interconnects, the interconnect is aligned orthogonally to a corresponding interconnect included in the second plurality of interconnects with respect to at least one of the substrate and the integrated circuit die when the integrated circuit package is at a first temperature within a range of about 0° C. to about −100° C., and
   the first plurality of interconnects is configured to be offset from the second plurality of interconnects when the integrated circuit package is at a second temperature above the first temperature.

2. The integrated circuit package of claim 1, wherein the first temperature is within a range of about −25° C. to about −100° C.

3. The integrated circuit package of claim 1, wherein the first temperature is within a range of about −50° C. to about −100° C.

4. The integrated circuit package of claim 1, wherein the offset of each interconnect in the first plurality of interconnects is configured to be a function of:
   a distance of each interconnect from a reference point of the substrate; and
   a difference between the first coefficient of thermal expansion and the second coefficient of thermal expansion.

5. The integrated circuit package of claim 1, wherein the offset of each interconnect in the first plurality of interconnects is proportional to a distance of each interconnect from a reference point of the substrate.

6. The integrated circuit package of claim 1, wherein the second coefficient of thermal expansion is greater than the first coefficient of thermal expansion.

7. The integrated circuit package of claim 1, wherein the substrate comprises an interposer.

8. The integrated circuit package of claim 1, wherein the substrate comprises a printed circuit board.

9. The integrated circuit package of claim 1, wherein the solder bump structures comprise at least one of solder balls, solder pads, and copper pillar bumps.

10. The integrated circuit package of claim 1, wherein the first and second plurality of interconnects comprise under bump metallurgy structures.

11. The integrated circuit package of claim 1, wherein the second temperature is an operating temperature within a range of about 50° C. to about 150° C.

\* \* \* \* \*